United States Patent
Sobue et al.

(10) Patent No.: US 7,471,064 B2
(45) Date of Patent: Dec. 30, 2008

(54) CIRCUIT SYSTEM FOR A BATTERY ELECTRONIC CONTROL UNIT

(75) Inventors: Satoshi Sobue, Nukata-gun (JP); Tomohisa Yamamoto, Hoi-gun (JP)

(73) Assignee: Denso Corporation, Kariya (JP)

( * ) Notice: Subject to any disclaimer, the term of this patent is extended or adjusted under 35 U.S.C. 154(b) by 414 days.

(21) Appl. No.: 11/052,065

(22) Filed: Feb. 8, 2005

(65) Prior Publication Data
US 2005/0194931 A1 Sep. 8, 2005

(30) Foreign Application Priority Data
Mar. 5, 2004 (JP) ............... 2004-062149

(51) Int. Cl.
*H02J 7/00* (2006.01)
*H02J 7/14* (2006.01)
(52) U.S. Cl. .............. 320/116; 320/118; 320/119; 320/120; 320/121; 320/122; 320/123
(58) Field of Classification Search ............ 320/116, 320/118–123
See application file for complete search history.

(56) References Cited

U.S. PATENT DOCUMENTS

| | | | |
|---|---|---|---|
| 4,977,339 A | 12/1990 | Denda | |
| 5,585,991 A * | 12/1996 | Williams | 361/30 |
| 6,281,660 B1 * | 8/2001 | Abe | 320/103 |
| 6,362,627 B1 | 3/2002 | Shimamoto et al. | |
| 6,411,912 B1 | 6/2002 | Sack | |
| 6,667,607 B2 | 12/2003 | Kawamura et al. | |
| 2002/0047685 A1 * | 4/2002 | Perelle | 320/119 |

FOREIGN PATENT DOCUMENTS

JP  A-2001-258148  9/2001

OTHER PUBLICATIONS

Maxim Integrated Products, Datasheet for MAX1894, Apr. 2002, Ver. 0, pp. 1-16.*
Maxim Integrated Products, Application Note 760, Jun. 18, 2001, pp. 1-7.*
Office Action dated Apr. 4, 2008 in corresponding Japanese Patent Application No. 2004-062149 (and English translation).

* cited by examiner

*Primary Examiner*—Akm E Ullah
*Assistant Examiner*—Jue Zhang
(74) *Attorney, Agent, or Firm*—Posz Law Group, PLC

(57) ABSTRACT

A battery ECU controls a main battery composed of a plurality of battery cells connected to each other in series. The battery cells are grouped into cell blocks each having a cell-block monitor circuit. A control unit controls charging/discharging processes on the basis of signals output by the cell-block monitor circuit. A signal output by a cell-block monitor circuit on a high-voltage side turns on a transistor for propagating a signal to a cell-block monitor circuit on a middle-voltage side. In the cell-block monitor circuit on a middle-voltage side, the propagated signal turns on another transistor for further propagating a signal to a cell-block monitor circuit on a low-voltage side. In the cell-block monitor circuit on a low-voltage side, the propagated signal turns on a further transistor for outputting a signal to a control unit.

10 Claims, 5 Drawing Sheets

CIRCUIT SYSTEM FOR A BATTERY ELECTRONIC CONTROL UNIT

CROSS REFERENCE TO RELATED APPLICATION

This application is based upon, claims the benefit of priority of, and incorporates by reference the contents of, Japanese Patent Application No. 2004-62149 filed on Mar. 5, 2004.

FIELD OF THE INVENTION

The present invention relates to a circuit system comprising a plurality of circuit blocks, each of which includes a circuit operating on the basis of a power-supply voltage in one of a plurality of voltage sub-ranges obtained from dividing the voltage range of a predetermined power supply.

BACKGROUND OF THE INVENTION

A battery employed in an electric-powered vehicle is required to generate a high voltage for driving a travel-motion motor. Normally, the battery includes a plurality of secondary batteries connected to each other in series. FIG. 6 is a diagram showing such a configuration as disclosed in JP-A-11-248,755, the contents of which are incorporated herein by reference. Voltage detection terminals T1, T3 and T5 of voltage generators V1 to V5 connected to each other in series are connected to a first multiplexer 1 comprising switches S1, S3 and S5. Voltage detection terminals T2, T4 and T6 of the voltage generators V1 to V5 are connected to a capacitor 3 via a second multiplexer 2 comprising switches S2, S4 and S6. Output terminals of the multiplexers 1 and 2 are further connected to a voltage measurement circuit 5 through the capacitor 3 and a sample switch 4, which comprises switches 4a and 4b.

In accordance with this conventional technology, the multiplexers 1 and 2 multiplex voltages of voltage generators V1 to V5 having their own reference electric potentials to select ones of the electric potentials so that only one voltage measurement circuit 5 is capable of sequentially measuring the selected electric potentials. It is an object of this conventional technology to simplify a flying capacitor technique traditionally adopted as described in FIG. 13 of JP-A-11-248,755.

The flying capacitor technique may be simplified by a configuration in which voltage measurement circuits are respectively provided for each of the voltage generators V1 to V5 and the voltage measurement circuits are connected in parallel to the voltage generators. With such a configuration, however, the reference electric potential of the voltage-generator circuit for generating a signal varies from circuit to circuit. This problem can be conceivably solved by selecting an electric potential of the signal by using multiplexers in a configuration disclosed in JP-A-11-248,755. In this configuration, however, since either the multiplexer 1 or the multiplexer 2 is selected, the polarity of a voltage selected from the voltages of the voltage generators V1 to V5 appears inverted alternately so that an absolute-value circuit 6 for correcting the voltage polarity is separately required. In addition, the use of a capacitor for propagation of a digital signal having a value represented by binary levels in place of an analog is not efficient.

In general, the problems can be conceivably solved by once insulating a propagated signal through the use of a device such as a photo coupler or a MOS relay prior to conversion of the voltage of the signal into a reference electric potential on the control side. However, this solution has a problem that an insulator for insulating a propagated signal is expensive and a photo-electrical conversion process carried out by the photo coupler introduces a delay in the propagation of the signal.

SUMMARY OF THE INVENTION

Accordingly, it is an object to provide a circuit system capable of propagating a signal without electrical insulation even if circuits included in the circuit system operate at reference voltages different from each other.

According to a first aspect of the circuit system, a signal output by any specific circuit pertaining to one of a plurality of circuit blocks operating on the basis of power-supply voltages having reference electric potentials different from each other is propagated to another circuit pertaining to another one of the circuit blocks by way of a signal propagation transistor of the specific circuit. A voltage applied to the signal propagation transistor may exceed a power-supply voltage range of a circuit block to which the specific circuit propagating the signal pertains. However, since a voltage-setting means operating for the specific circuit sets a voltage applied to the signal propagation transistor at a level lower than a breakdown voltage of the transistor, the transistor will never be damaged. Thus, electrical insulation is not required in signal propagation beyond a circuit block to which a circuit propagating the signal pertains. As a result, the size and price of the circuit system can be reduced.

According to a second aspect of the circuit system, an electric potential appearing at the anode of a Zener diode employed in the voltage-setting means operating for a circuit is prescribed by a Zener voltage having an electric potential lower than a voltage range of a circuit block to which the circuit pertains. In addition, an electric potential appearing on a power-supply side of a signal propagation transistor for the circuit is even lower than the electric potential appearing at the anode by a difference in electric potential between the control and output terminals of a voltage-setting transistor employed in the voltage-setting means. Thus, a voltage applied to the signal propagation transistor can be much reduced, being set at a level lower than the breakdown voltage of the transistor.

According to a third aspect of the circuit system, when a circuit pertaining to one of the circuit blocks outputs a signal to a signal propagation transistor for the circuit, the signal propagation transistor is put in a conductive state and propagates the signal to a circuit block on a lower-voltage side. Thus, a signal can be propagated from a circuit block on a higher-voltage side to a circuit block on a lower-voltage side.

According to a fourth aspect of the circuit system, when a circuit block on a higher-voltage side outputs a signal to a particular circuit block on a middle-voltage side, a signal input/output transistor pertaining to the particular circuit block is put in a conductive state and a signal propagation transistor pertaining to the particular circuit block propagates the signal to a signal input/output transistor for the circuit block on a lower-voltage side. Thus, since a signal output from a circuit block on the higher-voltage side can be relayed and propagated by the particular circuit block to a circuit block on the lower-voltage side, the signal can be propagated between the circuit block on the higher-voltage side and the circuit block on the lower-voltage side having a large difference in reference electric potential from the circuit block on the higher-voltage side, provided that the signal is propagated through the particular circuit block serving as a relay circuit block.

According to a fifth aspect of the circuit system, when a signal propagation transistor pertaining to a circuit block on a lower-voltage side is put in a conductive state, a signal input/output transistor pertaining to a circuit block on a higher-voltage side is also turned on, outputting a signal to a circuit pertaining to the circuit block on the higher-voltage side. Thus, a signal can be propagated from a circuit block on a low-voltage side to a circuit block on a high-voltage side.

According to a sixth aspect of the circuit system, when a signal propagation transistor pertaining to a circuit block on a lower-voltage side is put in a conductive state, a signal input/output transistor pertaining to a particular circuit block on a middle-voltage side is also turned on, and the signal propagation transistor pertaining to the particular circuit block propagates a signal to a circuit block on a higher-voltage side. Thus, since a signal output from a circuit block on the lower-voltage side can be relayed and propagated by the particular circuit block to a circuit block on the higher-voltage side, the signal can be propagated between the circuit block on the lower-voltage side and the circuit block on the higher-voltage side having a large difference in reference electric potential from the circuit block on the lower-voltage side, provided that the signal is propagated through the particular circuit block serving as a relay circuit block.

According to a seventh aspect of the circuit system, each of the circuit blocks is provided for one of cell blocks, which are connected to each other in series and each comprises a predetermined plurality of cells connected to each other in series, to form a secondary battery power supply, and a circuit pertaining to one of the circuit blocks functions as a charging/discharging control circuit for controlling charging and discharging processes of the cell blocks. That is, in such a battery power supply, the reference electric potential of any specific circuit block except the circuit block connected to the ground is the higher-voltage-side electric potential of a cell block adjacent to the specific circuit block on the lower-voltage side of the specific circuit block.

Thus, in an attempt made to use a circuit pertaining to any circuit block as a circuit for managing signals input to and output from each specific cell block as signals for controlling the charging and discharging processes of the specific cell block, naturally, a difference in voltage between the signals becomes a problem. By applying this circuit system, however, the signals can be propagated without insulating the signals and a configuration allowing the charging and discharging processes to be managed in a concentrated manner can be implemented at a low cost.

According to an eighth aspect of the circuit system, the secondary battery power supply functions as a motor-driving power supply for providing power to a motor for driving an electric-powered vehicle into a travel motion and the circuit system is applied to an ECU for controlling the motor-driving power supply. That is, the motor-driving power supply for providing power to a motor for driving an electric-powered vehicle into a travel motion comprises a number of secondary battery cells connected to each other in series and the terminal voltage of numerous battery cells is approximately in the range 100 V to 400 V. Thus, since the charging and discharging processes of a number of cell blocks need to be managed in a concentrated manner, the circuit system can be applied very effectively to the ECU.

According to a ninth aspect of the circuit system, the circuit system is created as an integrated circuit on a semiconductor substrate. That is, if a device such as a photo coupler is used as a means for insulating a propagated signal, a physical space of such a device is required in a portion for propagating the signal as a light beam. If a controller employing such a device for insulating a propagated signal is assumed to be a controller created as a semiconductor integrated circuit, a large area of the device is required, raising a problem of a big chip size and high cost of the controller. In accordance with the present circuit system, on the other hand, since a signal can be propagated between cell blocks without adoption of an insulating structure, the circuit system can be implemented as an integrated circuit having an extremely small size.

BRIEF DESCRIPTION OF THE DRAWINGS

The above and other objects, features and advantages of the present invention will become more apparent from the following detailed description made with reference to the accompanying drawings. In the drawings.

PREFERRED EMBODIMENTS OF THE INVENTION

First Embodiment

Figure 1:
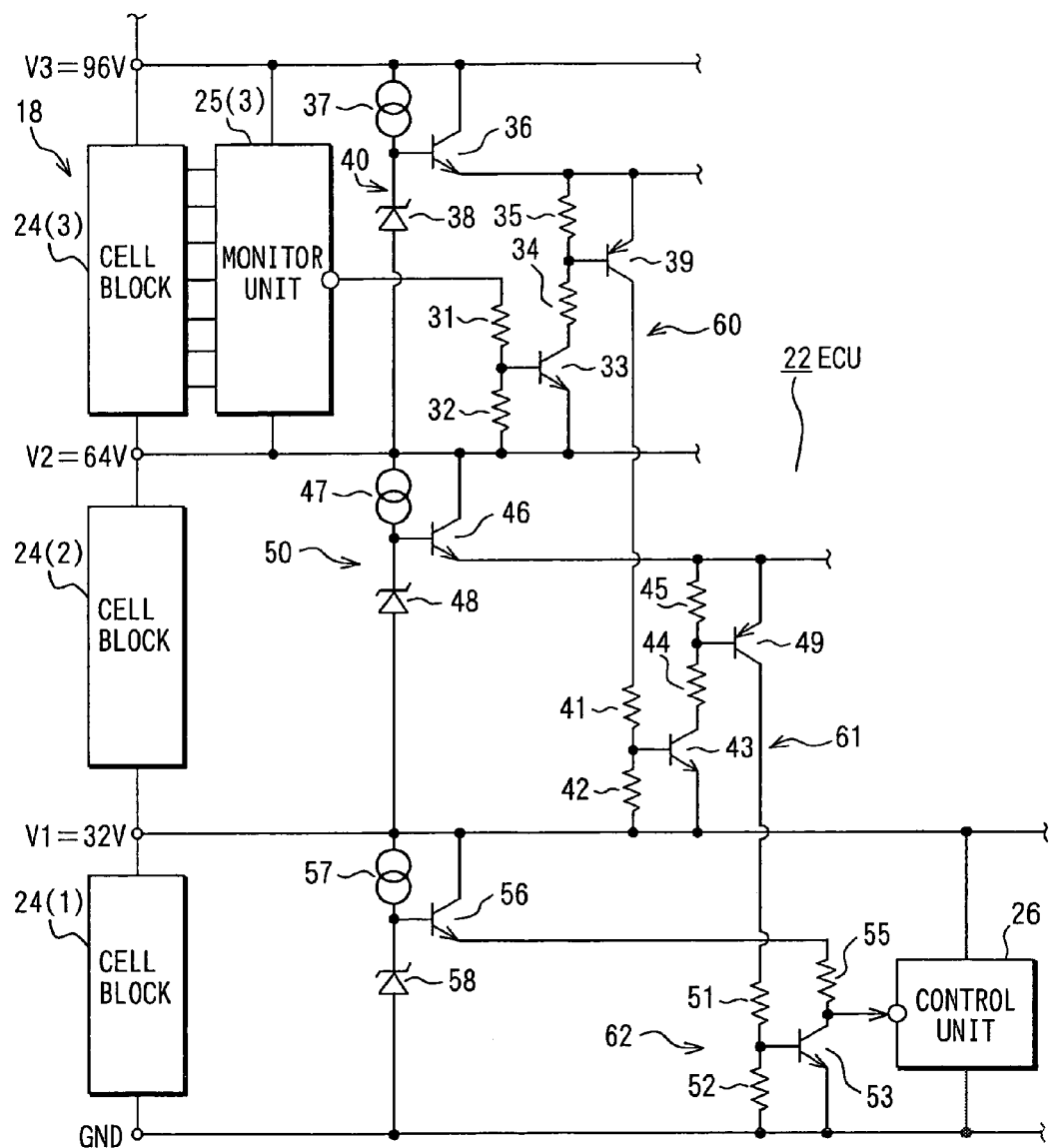
FIG. 1 is a circuit diagram of a circuit system for supplying a signal output by a cell-block monitor unit of a battery ECU to a control unit to control a main battery.
Figure 2:
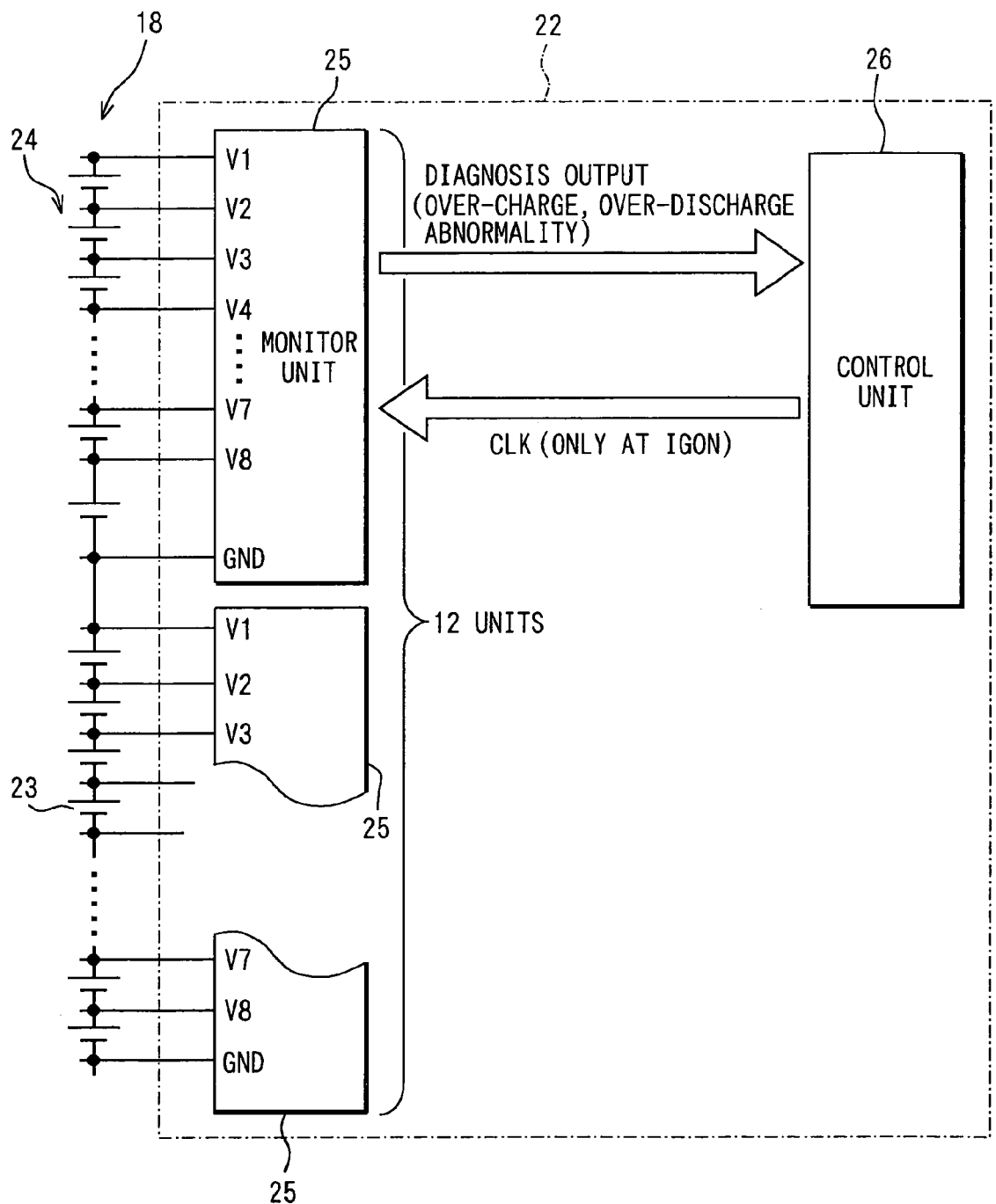
FIG. 2 is a block diagram of the battery ECU.
Figure 3:
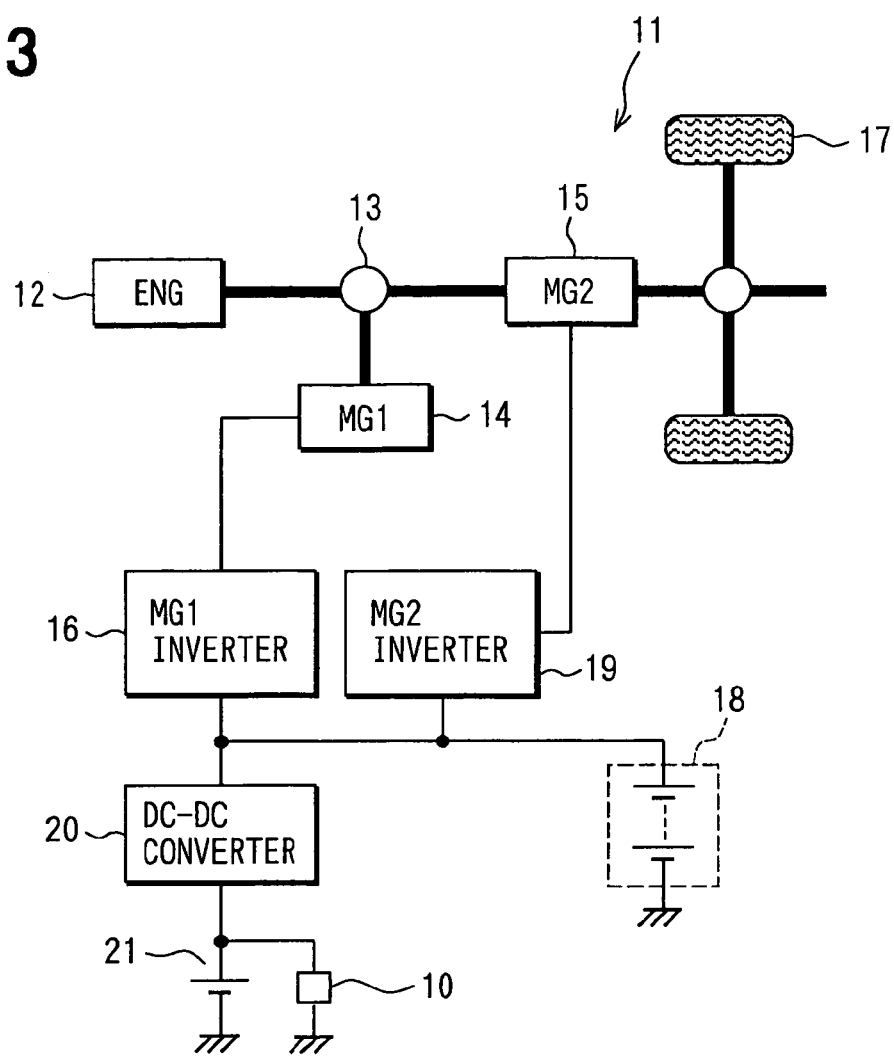
FIG. 3 is a block diagram of the system configuration of the hybrid electric-powered vehicle.

A first embodiment is explained by referring to FIGS. 1 to 3 for a case in which a circuit system is applied to a battery ECU for controlling a primary battery of a hybrid electric-powered vehicle. FIG. 3 is a diagram roughly showing the system configuration of a hybrid electric-powered vehicle (HEV) 11. In the HEV 11, a power division mechanism 13 divides a driving force generated by the engine (ENG) 12 into forces applied to motor/generators (MGs) 14 and 15. The MG 14 works mainly as a generator and adjusts the apportion of power through the power division mechanism 13. That is, the MG 14 executes the function of a transmission in addition to the function of a generator. An inverter 16 adjusts the output load of the MG 14. On the other hand, the MG 15 drives running wheels 17 of the HEV 11. The MG 15 has a configuration to drive the running wheels 17 in collaboration with the engine 12 in dependence on a control condition.

A main battery 18 supplies a voltage in the range 100 V to 400 V to an inverter 19 for driving the MG 15. On the other hand, a voltage generated by the MG 14 charges the main battery 18 through the inverter 16 and charges an auxiliary battery 21 through a DC/DC converter 20. Serving as an operation-voltage generator, the auxiliary battery 21 outputs an operation voltage of approximately 14V to auxiliary devices 10 such as lights, a blower motor and an ECU.

FIG. 2 is a diagram conceptually showing the configuration of a battery ECU 22 for controlling charging and discharging processes of the main battery 18. The main battery 18 comprises a plurality of cell blocks 24. Each of the plurality of cell blocks 24 comprises eight unit cells 23 connected to each other in series. Each of the unit cells 23 generates a standard terminal voltage of 4V. 12 cell blocks 24 connected to each other in series form the main battery 18. In this case, a terminal voltage of 364V (=8×12×4V) is generated at the main battery 18.

It is to be noted that, if terminal voltages of the unit cells 23 in the different cell blocks 24 need to be made uniform, a sash-cord-opening connection is adopted to share the unit cell 23 (V1) at the uppermost stage of the cell block 24 on the low-voltage side and the unit cell 23 (V8) at the lowermost stage of the cell block 24 on the high-voltage side. In addition, in accordance with the design, the sash-cord-opening connection can be applied to units that are each comprised of two to three cells.

The battery ECU 22 also includes a cell-block monitor unit (or a charging/discharging control circuit) 25 for each of the cell blocks 24. By monitoring the terminal voltage of each of the eight unit cells 23 in a cell block 24, the cell-block monitor unit 25 provided for the cell block 24 is capable of detecting an over-charging phenomenon or an over-discharging phenomenon. If an over-charging phenomenon or an over-discharging phenomenon is detected, a control unit (or a charging/discharging control circuit) 26 generates a diagnosis output.

The cell-block monitor unit 25 detects an over-charging phenomenon or an over-discharging phenomenon synchronously with a clock signal CLK generated by the control unit 26. The frequency of the clock signal CLK has a value ranging from several tens of Hz to several hundreds of Hz. The cell-block monitor unit 25 detects an over-charging phenomenon when the clock signal CLK is set at a high (H) level or an over-discharging phenomenon when the clock signal CLK is set at a low (L) level. It is to be noted that the voltage of an over-charging phenomenon is defined as a voltage exceeding typically 4.5V and the voltage of an over-discharging phenomenon is defined as a voltage lower than typically 0.7V. The voltage of an over-charging phenomenon and the voltage of an over-discharging phenomenon are each set by taking a predetermined margin into consideration.

On the basis of signals received from the 12 cell-block monitor units 25, the control unit 26 determines the amount of residual electric charge left in the main battery 18 in processing such as charging/discharging control and determination of an abnormality. In the case of a unit cell 23 detected in a cell block 24 as a cell experiencing an over-charging phenomenon, for example, the cell-block monitor unit 25 for the cell block 24 executes control to let a discharging process occur in the unit cell 23 through a discharging resistor. In the case of a unit cell 23 detected in a cell block 24 as a cell experiencing an over-discharging phenomenon, on the other hand, the cell-block monitor unit 25 for the cell block 24 executes control to stop a discharging process for the unit cell 23.

FIG. 1 is a diagram showing a typical configuration of a circuit in which signals output by the cell-block monitor units 25 are supplied to the control unit 26. The figure shows a portion for only three cell blocks 24 provided on the ground side as cell blocks composing the main battery 18. In this case, the voltage range of the first cell block 24(1) connected to the ground is 32V (=V1) to 0V, the voltage range of the second cell block 24(2) connected to the first cell block 24(1) is 64V (=V2) to 32V and the voltage range of the third cell block 24(3) connected to the second cell block 24(2) is 96V (=V3) to 64V. The first cell block 24(1), the second cell block 24(2) and the third cell block 24(3) are not shown in the figure for ease of illustration.

The cell block 24(1) is connected to a cell-block monitor unit 25(1) (not shown) for the cell block 24(1) and the control unit 26. The cell-block monitor unit 25(1) and the control unit 26 each include an internal power-supply circuit not shown in the figure. The power-supply circuit generates a typical internal operating power-supply voltage of 5V from the voltage of 32V. The cell-block monitor unit 25(1) and the control unit 26 each operate on the basis of the operating power-supply voltage of 5V. It is to be noted that FIG. 1 does not show the cell-block monitor unit 25(1) and the cell-block monitor unit 25 (2). On the other hand, the cell block 24(3) is connected to the cell-block monitor unit 25(3). The cell-block monitor unit 25(3) also generates an internal operating power-supply voltage of 5V by using the voltage of 64 V as a reference electric potential.

In the circuit configuration described above, when the cell-block monitor unit 25(3) makes an attempt to output a signal to the control unit 26, the signal cannot be supplied to the control unit 26 directly because the cell-block monitor unit 25(3) has an electric-potential reference difference from those of the others. In order to solve this problem, a device such as a photo coupler is employed in the conventional configuration. In the case of the present embodiment, on the other hand, the following configuration employing no device such as a photo coupler is adopted as a configuration capable of propagating a signal from a cell-block monitor unit 25(3) to the control unit 26.

Referring to the circuit associated with the cell block 24 (3), a signal output terminal of the cell-block monitor unit 25(3) is connected to the power supply line V2 through a series circuit composed of resistors 31 and 32. The junction point between the resistors 31 and 32 is connected to the base of an NPN transistor 33 serving as a signal input/output transistor. The emitter of the transistor 33 is connected to the power-supply line V2. The collector of the transistor 33 is connected to the emitter of an NPN transistor 36 serving as a voltage-setting transistor 36 through a series circuit comprised of resistors 34 and 35.

The collector of the transistor 36 is connected to the power-supply line V3. A series circuit comprising a current generator 37 and a Zener diode 38 is connected between the power-supply lines V3 and V2. The junction point between the current generator 37 and the Zener diode 38 is connected to the base of the transistor 36. The Zener voltage of the Zener diode 38 is set at a typical value of 5V. The emitter of the transistor 36 is connected to the emitter of a PNP transistor 39 serving as a signal propagation transistor. The base of the transistor 39 is connected to the junction point between the resistors 34 and 35. It is to be noted that the transistor 36, the current generator 37 and the Zener diode 38 form a voltage-setting means 40.

Referring to the circuit associated with the cell block 24(2), in this circuit, components identical with their respective counterparts employed in the circuit associated with the cell block 24(3) are denoted by the same reference numerals as the counterparts except that the reference numerals denoting the components employed in the circuit associated with the cell block 24(2) are obtained by shifting upward the reference numerals denoting the counterparts employed in the circuit associated with the cell block 24(3) by 10 to numbers in the range 41 to 50. The components employed in the circuit associated with the cell block 24(2) are connected in the same way as the components employed in the circuit associated with the cell block 24(3) except that the resistor 41 is connected to the collector of the transistor 39 instead of being connected to the signal output terminal of the cell-block monitor unit 25(3).

Referring to the circuit associated with the cell block 24(1), in this circuit, components identical with their respective counterparts employed in the circuit associated with the cell block 24(3) are also denoted by the same reference numerals as the counterparts except that the reference numerals denoting the components employed in the circuit associated with the cell block 24(1) are obtained by shifting upward the reference numerals denoting the counterparts employed in the circuit associated with the cell block 24(3) by 20 to numbers in the range 51 to 60. The components employed in the circuit associated with the cell block 24(1) are also connected in the same way as the components employed in the circuit associated with the cell block 24(3) except that the components corresponding to the resistor 34 and the transistor 39 do not exist. In addition, the resistor 51 is connected to the collector of the transistor 49 serving as the signal propagation transistor in the circuit associated with the cell block 24(2). Further, the collector of the transistor 53 serving as the signal input/output transistor is connected to the signal input terminal of the control unit 26.

It is to be noted that the circuit devices 31 to 39 associated with the cell block 24(3) compose a signal output circuit 60, the circuit devices 41 to 49 associated with the cell block 24(2) compose a signal relay circuit 61 and the circuit devices 51 to 58 associated with the cell block 24(1) compose a signal input circuit 62. Every cell block 24 and the circuit associated with the cell block 24 form a circuit block. A battery ECU 22 having a configuration including such circuit blocks is created as a semiconductor integrated circuit.

Next, the operation of the embodiment is explained. When a signal appearing at the signal output terminal of the cell-block monitor unit 25(3) associated with the cell block 24(3) is set at a low level, the transistor 33 is turned off, putting the transistor 39 in an off state as well. Accordingly, the transistors 43 and 49 associated with the cell block 24(2) as well as the transistor 53 associated with the cell block 24(1) are also turned off. As a result, a signal supplied to the signal input terminal of the control unit 26 is set at a high level.

As the signal appearing at the signal output terminal of the cell-block monitor unit 25(3) associated with the cell block 24(3) is set at a high level, the transistor 33 is turned on, putting the transistor 39 in an on state as well. In this state, the transistor 43 associated with the cell block 24(2) as a signal input/output transistor receives a signal propagated from the transistor 39 by way of the voltage-dividing resistor 41, entering an on state. The transistor 43 in the on state turns on the transistor 49, which serves as a signal propagation transistor. By the same token, the transistor 53 associated with the cell block 24(1) as a signal input/output transistor receives a signal propagated from the transistor 49 by way of the voltage-dividing resistor 51, entering an on state. The transistor 53 in the on state changes the state of the signal supplied to the signal input terminal of the control unit 26 from the high level to a low level. In this way, a signal output by the cell-block monitor unit 25(3) is propagated to the control unit 26 through the paths described above.

In the signal propagation, the transistor 39 propagates a signal from the cell block 24(3) to the cell block 24(2) with the collector of the transistor 39 connected to the power-supply line V1 (=32V) by the resistors 41 and 42. However, the emitter of the transistor 39 is set at an electric potential obtained as a result of subtraction of a difference VF (=0.7V) in voltage between the base and emitter of the transistor 36 from the Zener voltage (=5V) of the Zener diode 38. Since the Zener voltage of 5V is a voltage measured by taking the power-supply line V2 (=64V) as a reference, the difference in electric potential between the emitter and collector of the transistor 39 can be found as follows:

Difference=64V+5 V−0.7V−32V=36.3V.

Thus, if the transistor 39 has a breakdown voltage of about 37V, a signal can be propagated from the cell block 24(3) to the cell block 24(2), which as an electric-potential difference of 64V (=96V−32V) from the cell block 24(3) with the power-supply line V1 (=32V) taken as a reference. It is to be noted that the base and emitter of the transistor 36 serve respectively as control and output terminals of the transistor 36.

A signal is propagated from the cell block 24(2) to the cell block 24(1) in the same way. In this signal propagation, the transistor 49 propagates the signal from the cell block 24(2) to the cell block 24(1). In this case, however, a difference in electric potential between the emitter and collector of the transistor 49 can be found as follows:

Difference=32V+5 V−0.7V−0V=36.3V, where the term of 32V is the voltage of the power-supply line V1, the term of 5V is the Zener voltage of the Zener diode 48, the term of 0.7V is a difference in voltage between the base and emitter of the transistor 46 serving as a voltage-setting transistor and the term of 0V is the voltage of the ground line. In the cell block 24(1), the electric potential appearing at the collector of the transistor 53 is 5V−0.7V=4.3V. As shown in the figure, the collector of the transistor 53 is connected to the signal input terminal of the control unit 26.

It is to be noted that the cell-block monitor unit 25(2), which is associated with the cell block 24(2) but not shown in the figure, can also be configured as a monitor unit capable of outputting a signal to the control unit 26. In this case, the resistor 41 of the signal relay circuit 61 is connected to the signal output terminal of the cell-block monitor unit 25(2) instead of being connected to the collector of the transistor 39. That is, the signal relay circuit 61 is reconfigured into the same structured as the signal output circuit 60 associated with the cell block 24(3).

In accordance with the embodiment described above, the battery ECU 22 is provided to serve as a controller of the main battery 18 employed in the HEV 11 as a battery comprised of a plurality of unit cells 23 connected to each other in series, and comprises a cell-block monitor unit 25 provided for every cell block 24 as well as the control unit 26 for carrying out processing such as charging/discharging control on the basis of a signal output by each cell-block monitor unit 25. In the configuration of the battery ECU 22, a signal output by the cell-block monitor unit 25(3) on the higher-voltage side turns on the transistor 39, allowing a signal to be propagated to the circuit block associated with the cell block 24(2) on the middle-voltage side. In the circuit block associated with the cell block 24 (2), the propagated signal turns on the transistor 49, allowing a signal to be propagated to the circuit block associated with the cell block 24(1) on the lower-voltage side. In the circuit block associated with the cell block 24 (1), the propagated signal turns on the transistor 53, allowing a signal to be output to the control unit 26.

The voltage between the collector and emitter of the transistor 39 for propagating a signal from the cell block 24(3) on a higher-voltage side to the cell block 24(2) on a middle-voltage side is set at a magnitude smaller than the breakdown voltage of the transistor 39 by the voltage-setting means 40. By the same token, the voltage between the collector and emitter of the transistor 49 for propagating a signal from the cell block 24(2) on the middle-voltage side to the cell block 24(1) on a lower-voltage side is set at a magnitude smaller than the breakdown voltage of the transistor 49 by the voltage-setting means 50. Thus, electrical insulation using a device such as a photo coupler is not required for such signal propagation. As a result, the size and cost of the circuit system can be reduced.

In addition, since the voltage-setting means 40 is composed of the transistor 36, the current generator 37 and the Zener diode 38, the electric potential appearing at the emitter of the transistor 39 can be set at a level obtained by subtracting a difference in voltage between the base and emitter of the transistor 36 from the electric potential appearing at the anode of the Zener diode 38. Thus, the voltage applied to the transistor 39 can be reduced. By the same token, since the voltage-setting means 50 is composed of the transistor 46, the current generator 47 and the Zener diode 48, the electric potential appearing at the emitter of the transistor 49 can be set at a level obtained by subtracting a difference in voltage between the base and emitter of the transistor 46 from the electric potential appearing at the anode of the Zener diode 48. Thus, the voltage applied to the transistor 49 can be reduced.

In addition, the signal relay circuit 61 associated with the cell block 24(2) receives a signal propagated from the cell block 24(3) by way of the signal output circuit 60 associated with the cell block 24(3), and passes on the signal to the signal input circuit 62 associated with the cell block 24(1). Thus, by propagating a signal through a sequence of signal relay circuits each having the same configuration as the signal relay circuit 61, the signal can be transferred from one circuit block to another circuit block by way of one or more circuit blocks.

Furthermore, the present embodiment is applied to the battery ECU 22 for controlling charging and discharging processes of the main battery 18 employed in the HEV 11. In the battery ECU 22, a signal output by a cell-block monitor unit 25, which is associated with a cell block 24 and operates on the basis of a reference voltage varying from cell block 24 to cell block 24, propagates to the control unit 26. Thus, the present embodiment can be effectively applied to a configuration for executing management control in a concentrated manner.

Further, the battery ECU 22 is created as a semiconductor integrated circuit. If a device such as a photo coupler is used as a means for insulating a propagated signal, a physical space of such a device is required in a portion for propagating the signal as a light beam. If an ECU controller employing such a device for insulating a propagated signal is assumed to be a controller created as a semiconductor integrated circuit, a large area of the device is required, raising a problem of a big chip size and high cost of the controller. For this reason, the conventional battery ECU is composed of discrete circuit devices. In accordance with the present embodiment, on the other hand, since a signal can be propagated between cell blocks 24 without adoption of an insulating structure, the battery ECU 22 can be implemented as an integrated circuit having an extremely small size.

Second Embodiment

Figure 4:
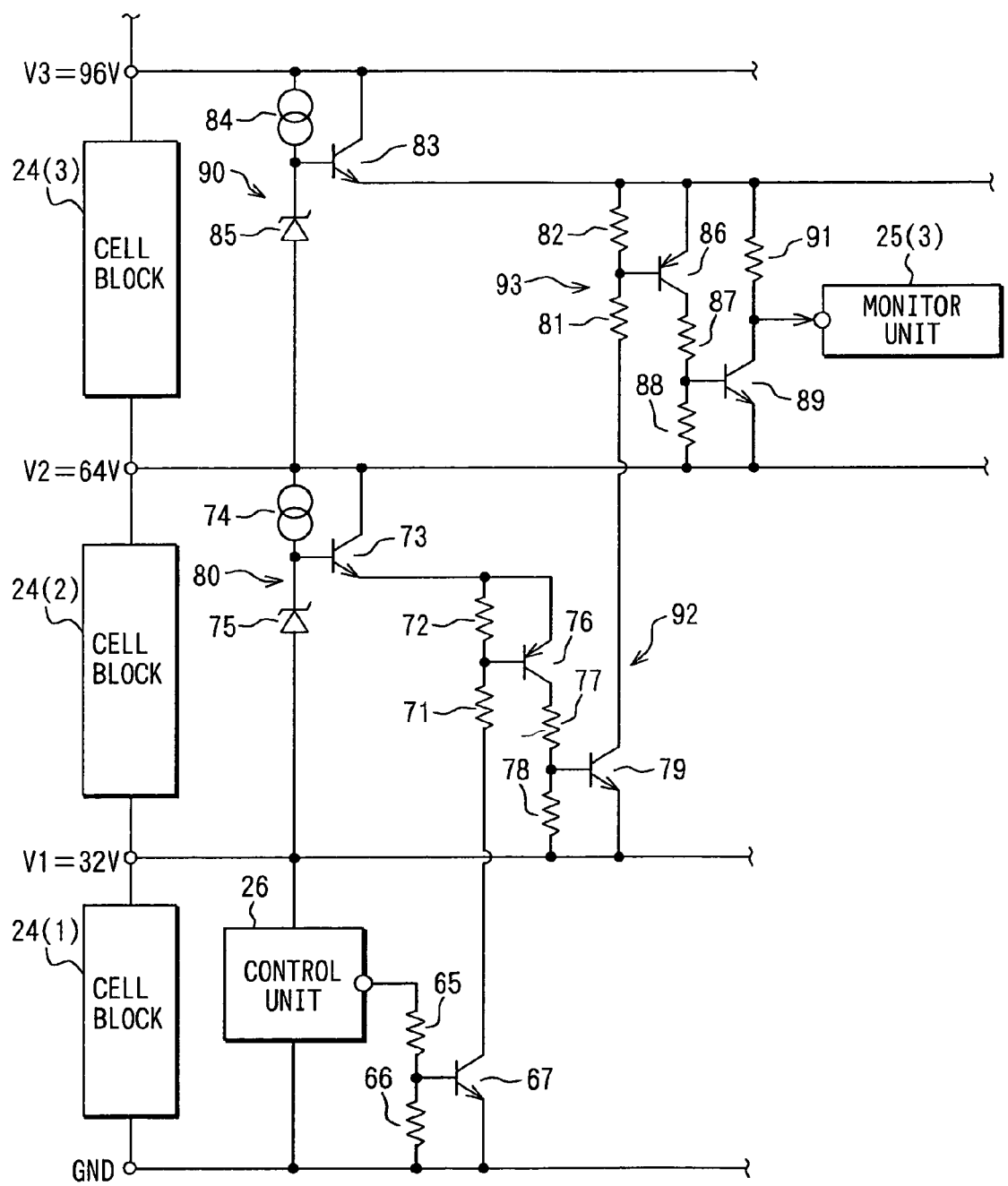
FIG. 4 is a circuit diagram of the circuit diagram according to a second embodiment.
Figure 6:
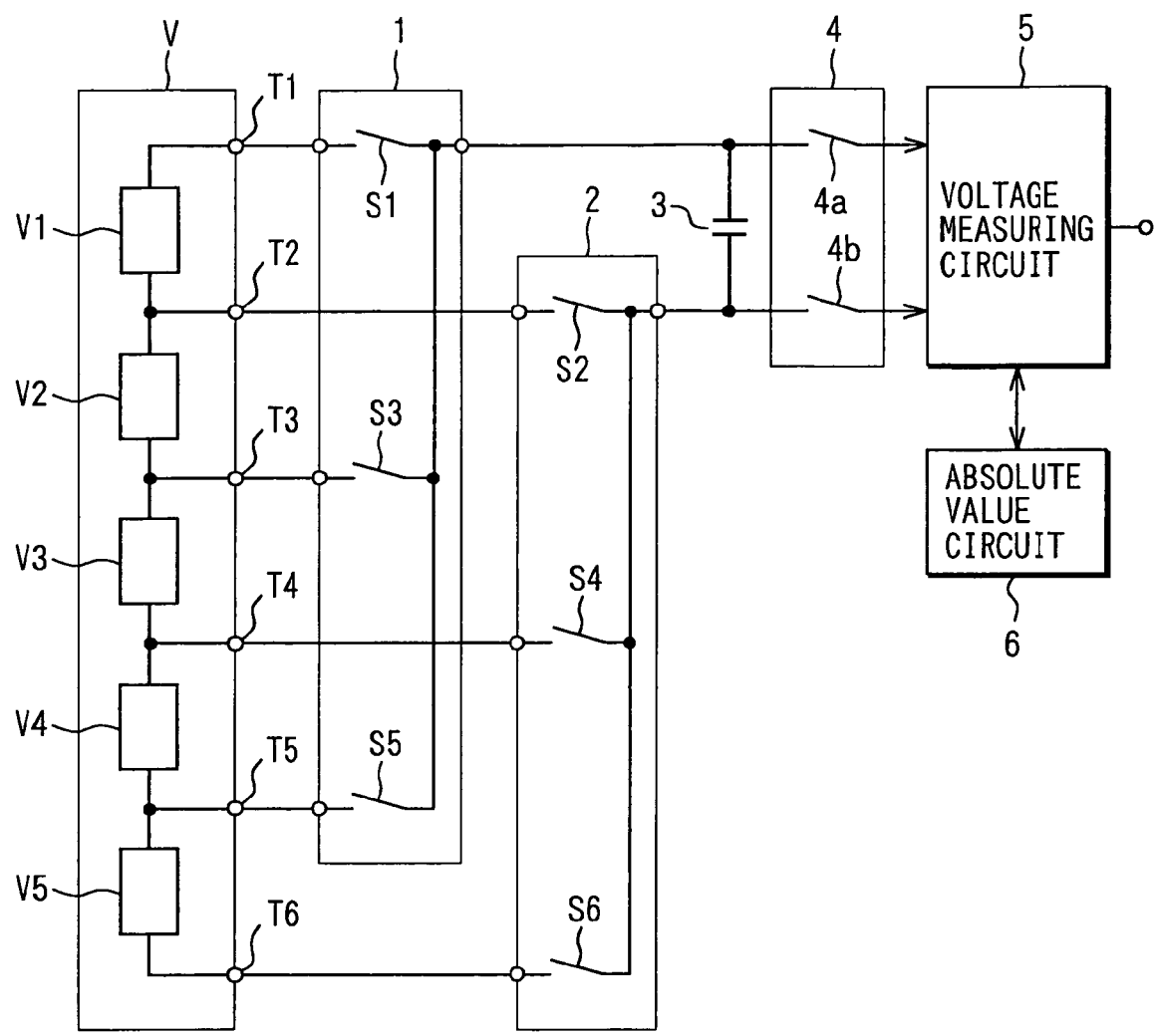
FIG. 6 is a diagram corresponding to FIG. 1 according to conventional technology.

FIG. 4 is a diagram showing a second embodiment. In this figure, circuit elements identical with their respective counterparts employed in the first embodiment are denoted by the same reference numerals as the counterparts and their descriptions are not repeated in order to avoid duplications. Only differences between the first and second embodiments are explained. The second embodiment implements a circuit configuration in which the control unit 26 on the low-voltage side outputs a signal to the cell-block monitor unit 25(3) on the high-voltage side. The figure shows only a portion of the battery ECU 22.

An output terminal of the control unit 26 is connected to the ground through a series circuit comprised of resistors 65 and 66. The junction point between the resistors 65 and 66 is connected to the base of an NPN transistor 67, which serves as a signal propagation transistor. The emitter of the transistor 67 is connected to the ground. On the other hand, the collector of the transistor 67 is connected to the emitter of an NPN transistor 73 of the cell block 24(2) through a series circuit comprised of resistors 71 and 72.

In the cell block 24(2), the collector of the transistor 73 is connected to the power-supply line V2. A series circuit comprising a current generator 74 and a Zener diode 75 is connected between the power-supply lines V1 and V2. The junction point between the current generator 74 and the Zener diode 75 is connected to the base of the transistor 73. The emitter of the Zener diode 75 is connected to the emitter of a PNP transistor 76, which serves as a signal input/output transistor. The base of the transistor 76 is connected to the junction point between the resistors 71 and 72. The collector of the transistor 76 is connected to the power-supply line V1 through a series circuit comprised of resistors 77 and 78.

The junction point between the resistors 77 and 78 is connected to the base of an NPN transistor 79, which serves as a signal propagation transistor. The collector of the transistor 79 is connected to the emitter of an NPN transistor 83 for the cell block 24(3) through a series circuit comprising of resistors 81 and 82. It is to be noted that the transistor 73, the current generator 74 and the Zener diode 75 form a voltage-setting means 80.

In the cell block 24(3), circuit elements identical with their respective counterparts employed in the circuit associated with the cell block 24(2) are denoted by the same reference numerals as the counterparts except that the reference numerals denoting the circuit elements employed in the circuit associated with the cell block 24(3) are obtained by shifting upward the reference numerals denoting the counterparts employed in the circuit associated with the cell block 24(2) by 10 to numbers in the range 81 to 90. The components employed in the circuit associated with the cell block 24(3) are connected in the same way as the components employed in the circuit associated with the cell block 24(2) except that the collector of a transistor 89 serving as the signal input/output transistor is connected to a signal input terminal of the cell-block monitor unit 25(3) and connected to the emitter of a transistor 83 through a resistor 91. It is to be noted that the circuit elements 71 to 79 in the cell block 24(2) form a signal relay circuit 92 and the circuit elements 81 to 89 in the cell block 24(3) form a signal output circuit 93.

Next, the operation of the second embodiment is explained. When a signal appearing at the signal output terminal of the control unit 26 associated with the cell block 24(1) is set at a low level, the transistor 67 is turned off, putting the transistor 76 and transistor 79 associated with the cell block 24(2) in an off state as well. Accordingly, the transistor 86 associated with the cell block 24(3) as a signal input/output transistor and the transistor 89 associated with the cell block 24(3) also as a signal input/output transistor are also turned off. As a result, a signal supplied to the signal input terminal of the cell-block monitor unit 25(3) is set at a high level.

Then, as the signal appearing at the signal output terminal of the control unit 26 associated with the cell block 24(1) is set at a high level, the transistor 67 is turned on and the transistor 76 associated with the cell block 24(2) receives the signal through the resistor 71, entering an on state as well. Since the transistor 76 is turned on, the transistor 79 also enters an on state. By the same token, the transistor 86 associated with the cell block 24(3) receives the propagated signal from the transistor 79 by way of the voltage-dividing resistor 81, entering an on state. Since the transistor 86 is turned on, the transistor 89 also enters an on state, changing the signal supplied to the signal input terminal of the cell-block monitor unit 25(3) from the high level to a low level. Thus, a signal output by the control unit 26 is propagated to the cell-block monitor unit 25(3) through the paths described above.

In the signal propagation, the transistor 67 propagates the signal from the cell block 24(1) to the cell block 24(2). As described above, the collector of the transistor 67 is connected to the emitter of the transistor 73 through the resistors 71 and 72. However, an electric potential appearing at the emitter of the transistor 73 is set at a level obtained as a result of subtraction of a difference VF (=0.7V) in voltage between the base and emitter of the transistor 73 from the Zener voltage (=5V) of the Zener diode 75 where the Zener voltage of 5V is a voltage measured by taking the power-supply line V1 (=32v) as a reference.

Thus, a difference in electric potential between the emitter and collector of the transistor 67 can be found as follows:

Difference=32V+5V−0.7V−0V=36.3V.

Similar to the first embodiment, if the transistor 67 has a breakdown voltage of about 37V, a signal can be propagated from the cell block 24(1) to the cell block 24(2), which has an electric-potential difference of 64V from the cell block 24(1) with the ground taken as a reference. The signal is propagated from the cell block 24(2) to the cell block 24(3) through the same propagation structure as the propagation of the signal from the cell block 24(1) to the cell block 24(2). In the propagation of the signal from the cell block 24(2) to the cell block 24(3), the transistor 79 propagates the signal from the cell block 24(2) to the cell block 24(3). In this case, a difference in electric potential between the emitter and collector of the transistor 79 can be found as follows:

Difference=64V+5 V−0.7V−32V=36.3V.

It is to be noted that the control unit 26 may supply a signal to the cell-block monitor unit 25(2), which is associated with the cell block 24(2) but not shown in the figure. In this case, the transistor 79 employed in the signal relay circuit 92 is connected to the power-supply line V2 through a resistor and the signal input terminal of the cell-block monitor unit 25(2) to give the same configuration as the signal input circuit 93 associated with the cell block 24(3).

In accordance with the second embodiment described above, when the signal appearing at the signal output terminal of the control unit 26 associated with the cell block 24(1) is changed from a low level to a high level, the transistor 67 is turned on and the transistor 76 associated with the cell block 24(2) receives the signal, entering an on state as well. Since the transistor 76 is turned on, the transistor 79 also enters an on state. By the same token, the transistor 86 associated with the cell block 24(3) receives the propagated signal from the transistor 79, entering an on state. Since the transistor 86 is turned on, the transistor 89 also enters an on state, propagating the signal to the signal input terminal of the cell-block monitor unit 25(3).

In the signal propagation described above, the electric potential appearing at the collector of the transistor 67 is set by the voltage-setting means 80 associated with the cell block 24(2) at a level not exceeding the breakdown voltage of the transistor 67. By the same token, the electric potential appearing at the collector of the transistor 79 is set by the voltage-setting means 90 associated with the cell block 24(3) at a level not exceeding the breakdown voltage of the transistor 79. Thus, a signal can be propagated from the cell block 24(1) on a lower-voltage side to the cell block 24(3) on a higher-voltage side without electrical insulation.

In addition, by passing through a propagated signal through a sequence of signal relay circuits each having the same configuration as the signal relay circuit 92 associated with the cell block 24(2), a signal can be propagated from a cell block 24 to another cell block 24 by way of three or more circuit blocks.

Figure 5:
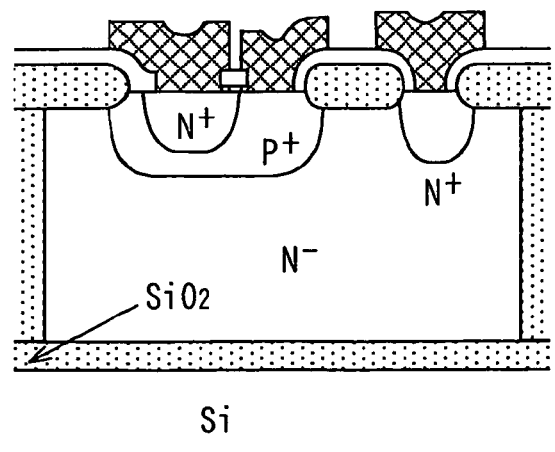
FIG. 5 is a cross-sectional diagram of a semiconductor for implementing the transistors shown in FIG. 1.

Each of the NPN transistors and the PNP transistors of the above embodiments is constructed to have a dielectric isolation structure. FIG. 5 schematically shows an exemplary configuration of one of such NPN transistors having the dielectric isolation structure. The NPN transistor shown in FIG. 5 is electrically insulated from its adjacent transistor (not shown) by a layer of a dielectric material (SiO2). In the case of the dielectric isolation structure, since there is no parasitic device or element, it is relatively easy to electrically insulate between the transistors (or devices) Specifically, for example, in a case of a PN junction isolation structure (not shown), the critical electric field, i.e., the maximum tolerable voltage is generally equal to or less than 100 V. In contrast, in the case of the dielectric isolation structure shown in FIG. 5, the critical electric field is generally equal to or greater than 100 V. Thus, the transistors of the above embodiments can advantageously withstand the relatively high voltages. It should be noted that although the transistors of the above embodiments are constructed to have the dielectric isolation structure, the transistors can have any other suitable structure other than the dielectric isolation structure, if desired.

The scope of the present invention is not limited to the embodiments described above by referring to the diagrams. For example, the embodiments can be modified as follows.

A signal can be propagated between the cell blocks 24(2) and 24(3) from a higher-voltage side to a lower-voltage side and vice versa. In addition, since the signal output circuit 60, the signal relay circuit 61 and the signal input circuit 62, which are employed in the first embodiment, as well as the signal relay circuit 92 and the signal input circuit 93, which are employed in the second embodiment, exhibit an property of symmetry, propagation paths of a signal between circuits associated with different cell blocks 24 can be implemented with an extremely high degree of flexibility.

If a signal needs to be propagated at a correct phase, the level of the signal can be properly inverted by adding a necessary device.

The voltage-setting means is not limited to the configuration, which comprises a current generator, a Zener diode and an NPN transistor. Rather, the voltage-setting means can have any configuration as long as the configuration sets a voltage applied to a signal propagation transistor associated with the voltage-setting means at a magnitude smaller than the breakdown voltage of the transistor.

The battery ECU 22 can be composed of discrete devices.

The voltage range of the circuit block is not limited to 32V. That is, the voltage range can be broader or narrower. For example, if the transistors are each implemented as a semiconductor device having a trench separation structure, a breakdown voltage of at least 100V can be guaranteed. Thus, a voltage set by the voltage-setting means can be properly determined in accordance with actual design specifications of the voltage range and the breakdown voltage of the used circuit elements.

The application of the present invention is not limited to the battery ECU 22 for controlling the main battery 18 comprising a plurality of unit cells 23 connected to each other in series. For example, the present invention can also be applied to a plurality of circuit blocks each having a power-supply voltage in one of a plurality of voltage ranges, which are obtained by dividing the output of a single battery by using voltage-dividing resistors. In addition, the present invention can also be applied to a configuration comprising only two circuit blocks. That is, the present invention can be used as a solution to a problem of difficulty encountered in a circuit system in directly propagating a signal between circuit blocks having different reference electric potentials as a problem caused by the differences in electric potential between the circuit blocks composing the circuit system.

What is claimed is:

1. A circuit system comprising:
a plurality of circuit blocks, each including a circuit driven to operate by a power supply voltage in one of a plurality of voltage ranges obtained as a result of delimiting the voltage range of a predetermined power supply;
signal propagation transistors each used for propagating a signal output by a first circuit pertaining to a specific one of the circuit blocks to a second circuit pertaining to another one of the circuit blocks; and
a voltage-setting means for setting a voltage applied to a particular one of the signal propagation transistors at a magnitude smaller than a breakdown voltage of the particular signal propagation transistor, wherein
the voltage applied is further associated with a difference between a first electric-potential associated with the first circuit and a second electric-potential associated with the second circuit, the difference including a voltage drop of the voltage-setting means, the difference being greater than a breakdown voltage of the particular one of the signal propagation transistors, and
the voltage-setting means for setting a voltage applied to a particular one of the circuit block includes
a series circuit including a current generator and a Zener diode, which are connected between a higher electric-potential side and a lower electric-potential side of the particular circuit block, and
a voltage-setting transistor, which has a control terminal connected to the anode of the Zener diode and is connected in series between the higher electric-potential side of the particular circuit block and the signal propagation transistor.

2. The circuit system according to claim 1, wherein a specific one of the circuit blocks includes:
a signal output transistor, which is turned on when the specific circuit block outputs a signal.

3. The circuit system according to claim 2, wherein the specific one of the circuit blocks includes a signal relay circuit comprising:
a signal input transistor, which is turned on when receiving a signal from one of the circuit blocks on a higher voltage side; and
a signal propagation transistor, which outputs a signal to one of the circuit blocks on the lower voltage side when the signal input transistor is turned on.

4. The circuit system according to claim 1, wherein a specific one of the circuit blocks includes a signal output circuit comprising:
a signal input transistor, which is turned on when the signal propagation transistor included in one of the circuit blocks on the lower voltage side is turned on; and
a signal output transistor, which outputs a signal to a circuit pertaining to the specific circuit block when the signal input transistor is turned on.

5. A circuit system according to claim 4, wherein:
another specific one of the circuit blocks includes a signal relay circuit comprising:
a signal input transistor, which is turned on when a signal propagation transistor included in the particular one of the circuit blocks on the lower voltage side is turned on; and
a signal propagation transistor, which outputs a signal to one of the circuit blocks on a higher voltage side when the signal input transistor is turned on, and
the voltage-setting means of the signal relay circuit sets a voltage applied to the signal propagation transistor included in the particular circuit block on the lower voltage side at a magnitude smaller than a breakdown voltage of the signal propagation transistor.

6. The circuit system according to claim 1, wherein:
each of the circuit blocks is disposed within one of a plurality of cell blocks connected to each other in series, each of the plurality of cell blocks including a predetermined plurality of cells connected to each other in series to form a secondary battery power supply; and
the circuit pertaining to the circuit blocks includes a charging/discharging control circuit for controlling charging and discharging processes of the cell blocks.

7. The circuit system according to claim 6, wherein:
the secondary battery power supply functions as a motor-driving power supply for providing power to a motor for driving a vehicle into a travel motion; and
the circuit system is applied to an electronic control unit for controlling the motor-driving power supply.

8. The circuit system according to claim 1, wherein the circuit system includes an integrated circuit built on a semiconductor substrate.

9. An electronic control unit (ECU) for controlling a battery having a plurality of cell blocks connected together in series, wherein each of the plurality of cell blocks is operative within a voltage range obtained by dividing a voltage range of the battery, the ECU comprising:
a plurality of cell block monitoring units respectively connected to the plurality of cell blocks to detect one of an over-charging and an over-discharging of the respective cell block and to adjust a terminal voltage of the respective cell block based on the detected one of the over-charging and the over-discharging;
a control unit for generating a diagnosis output in accordance with the detected one of the over-charging and the over-discharging; and
a plurality of signal circuits respectively disposed within each of the plurality of cell blocks for connecting the control unit to the plurality of cell block monitoring units, wherein
at least one of the plurality of signal circuits includes
a signal propagating transistor for propagating a signal from one of the control unit and one of the cell blocks having a first electric-potential to another one of the cell blocks having a second electric-potential, and
a voltage-setting means for setting a voltage applied to the signal propagation transistor at a magnitude smaller than a breakdown voltage of the signal propagation transistor, wherein the voltage is further associated with a difference between the first electric-potential and the second electric-potential, the difference including a voltage drop of the voltage setting means, the difference being greater than a breakdown voltage of the signal propagation transistor, wherein
the voltage-setting means applied to the signal propagation transistor includes
a series circuit including a current generator and a Zener diode, which are connected between a higher electric-potential side and a lower electric-potential side of the one cell block having a first electric-potential, and
a voltage-setting transistor, which has a control terminal connected to the anode of the Zener diode and is connected in series between the higher electric-potential side of the one cell block having a first electric-potential and the signal propagation transistor.

10. A circuit system including a plurality of circuit blocks operating at different power supply voltages divided from a power supply, the circuit system capable of propagating a signal without electrical insulation between the plurality of circuit blocks, the circuit system comprising:
 a first circuit associated with a first circuit block of the plurality of circuit blocks and a first power supply;
 a second circuit associated with a second circuit black of the plurality of circuit blocks and a second power supply,
 wherein the first circuit includes a signal propagation transistor propagating the signal on a propagation path to the second circuit associated with the second circuit block, the signal propagation transistor having a predetermined collector-to-emitter breakdown voltage; and
 voltage-setting means coupled between the signal propagation transistor and the first power supply through a circuit path apart from the propagation path, the voltage-setting means for setting a collector-to-emitter voltage across the signal propagation transistor at a level lower than the predetermined collector-to-emitter breakdown voltage when a difference between the first power supply and the second power supply exceeds the collector-to-emitter breakdown voltage, the difference including a voltage drop associated with the voltage-setting means, wherein
 the voltage-setting means includes
  a series circuit including a current generator and a Zener diode, which are connected between a higher electric-potential side and a lower electric-potential side of the first circuit block, and
  a voltage-setting transistor, which has a control terminal connected to the anode of the Zener diode and is connected in series between the higher electric-potential side of the first circuit block and the signal propagation transistor.

\* \* \* \* \*